US 6,743,569 B2

(12) United States Patent
Motoi et al.

(10) Patent No.: US 6,743,569 B2
(45) Date of Patent: Jun. 1, 2004

(54) PHOTOSENSITIVE RESIN LAMINATE AND PRODUCTION METHOD THEREOF

(75) Inventors: Keiichi Motoi, Ohtsu (JP); Yuji Taguchi, Ohtsu (JP)

(73) Assignee: Toyo Boseki Kabushiki Kaisha, Osaka (JP)

( * ) Notice: Subject to any disclaimer, the term of this patent is extended or adjusted under 35 U.S.C. 154(b) by 0 days.

(21) Appl. No.: 09/537,418

(22) Filed: Mar. 29, 2000

(65) Prior Publication Data
US 2002/0006581 A1 Jan. 17, 2002

(30) Foreign Application Priority Data

Mar. 31, 1999 (JP) ............ 11/092482
Apr. 1, 1999 (JP) ............ 11/095509
Jul. 19, 1999 (JP) ............ 11/205237

(51) Int. Cl.[7] ............ G03C 1/76; G03C 1/795; G03F 7/09
(52) U.S. Cl. ............ 430/271.1; 430/273.1
(58) Field of Search ............ 430/271.1, 273.1

(56) References Cited

U.S. PATENT DOCUMENTS

| | | | | |
|---|---|---|---|---|
| 4,101,324 A | * | 7/1978 | Mizuno et al. | 430/306 |
| 4,231,910 A | * | 11/1980 | Plueddemann | 524/109 |
| 4,234,644 A | * | 11/1980 | Blake et al. | 428/204 |
| 4,480,094 A | * | 10/1984 | Hagiwara et al. | 544/222 |
| 5,053,311 A | * | 10/1991 | Makino et al. | 430/166 |
| 5,281,473 A | * | 1/1994 | Ishiwata et al. | 428/345 |
| 5,304,453 A | * | 4/1994 | Lin | 430/252 |
| 5,710,746 A | * | 1/1998 | Uchiyama et al. | 369/13 |
| 5,824,444 A | * | 10/1998 | Kinoshita et al. | 430/59 |
| 6,063,467 A | * | 5/2000 | Kanno | 428/64.1 |
| 6,184,457 B1 | * | 2/2001 | Tsuzuki et al. | 136/256 |
| 6,226,067 B1 | * | 5/2001 | Nishiguchi et al. | 349/155 |
| 6,387,604 B2 | * | 5/2002 | Sampei | 430/350 |

FOREIGN PATENT DOCUMENTS

| | | |
|---|---|---|
| EP | 0 058 737 | 9/1982 |
| EP | 0 551 867 A1 | 7/1993 |
| EP | 0 864 925 A1 | 9/1998 |
| JP | 58055927 | 4/1983 |
| JP | 9006267 | 1/1997 |

* cited by examiner

Primary Examiner—Mark Huff
Assistant Examiner—Sin J. Lee
(74) Attorney, Agent, or Firm—Morrison & Foerster LLP

(57) ABSTRACT

A photosensitive resin laminate comprising a support and a photosensitive resin layer formed on the support directly or via an adhesive layer, wherein the support has a Shore D hardness of not less than 35°, a thickness of not less than 1 mm, and a total light transmission of not less than 70%. The photosensitive resin laminate of the present invention permits easy bending of the support and is superior in design as evidenced by the thickness and transparency of the support. The inventive laminate is free of generation of odor from the support and can provide a photosensitive resin laminate suitable for sign plate, a sign plate and the like. According to the method of the present invention, a photosensitive resin laminate can be produced efficiently even if a support involved is thick, hard or in a number of sheets, and greatly contributes to the pertinent industrial field.

12 Claims, No Drawings

PHOTOSENSITIVE RESIN LAMINATE AND PRODUCTION METHOD THEREOF

TECHNICAL FIELD OF THE INVENTION

The present invention relates to a photosensitive resin laminate suitably used for a sign plate, such as display panel, decoration shield, name plate, Braille slate and the like, and a production method thereof, by which the photosensitive resin laminate affords a sign plate and the like that are characterized by superior production efficiency, absence of odor during processing, superior adhesive property and particularly excellent design.

BACKGROUND OF THE INVENTION

A photosensitive resin laminate for a sign plate, which is obtained by exposing a photosensitive resin layer through a pattern and developing the layer, has been disclosed in JP-A-58-55927, JP-A-9-6267 and the like. This laminate has been used for a display panel having a relief, a sign plate carrying Braille and the like.

However, sign plates for use in these days are required to stand bending during processing, to be transparent and the like. The widely used photosensitive resin laminates having a phenol support are not suitable for bending processing or producing transparent sign plates. Accordingly, there has arisen a demand on a photosensitive resin laminate suitable for processing into a sign plate having a good design.

Conventional photosensitive resin laminates have been produced by a method such as solution cast, melt extrusion, thermal compression and the like. However, solution cast, melt extrusion and some other methods are associated with difficulty in that a laminate to be processed is so thick or stiff that the support does not deform, and therefor, does not follow the roller that transports the laminate during processing. When the support to be laminated is not in a single solid sheet, the discontinuity of the support easily causes loss of a resin to be used.

It is therefore an object of the present invention to afford a photosensitive resin laminate for a sign plate, such as display panel, decoration shield, name plate, Braille slate and the like, particularly, a photosensitive resin laminate for a sign plate with a good design, which permits bending during processing of a sign plate and processing into a transparent sign plate, a photosensitive resin laminate free of generation of odor from the support and having superior resistance to the solvent used for processing, and a production method of a photosensitive resin laminate that affords efficient production of the laminate having a thick support, a stiff support or support in a number of sheets.

SUMMARY OF THE INVENTION

Such object can be achieved by the following invention.

According to the present invention, there is provided a photosensitive resin laminate comprising a photosensitive resin layer and a support, the photosensitive resin layer being directly or via an adhesive layer formed on the support, wherein the support has a Shore D hardness of not less than 35°, a thickness of not less than 1 mm and a total light transmission of not less than 70%. A photosensitive resin laminate having the above-mentioned characteristics, wherein the support has a thermal deformation temperature of 60° C.–90° C., or the support is made from a polyethylene terephthalate resin, a modified polyethylene terephthalate resin, an acrylic resin or a modified acrylic resin, affords particularly superior effects.

When a solid photosensitive resin layer is press laminated on a support having a Shore D hardness of not less than 35° and a thickness of not less than 1 mm in the presence of a solvent that dissolves or swells the photosensitive resin layer, in the interface between the support and the photosensitive resin layer, or when the photosensitive resin layer to be laminated is heated before press lamination to a temperature of not less than the softening point of the resin and less than the melting temperature of the resin, the above-mentioned photosensitive resin laminate can be obtained particularly efficiently.

DETAILED DESCRIPTION OF THE INVENTION

The present invention is explained in detail in the following.

The support of the present invention has a thickness of not less than 1 mm, preferably a thickness suitable for use and design is chosen from the range of 1 mm–10 mm. When the thickness is less than 1 mm, the support tends to warp, which is unsuitable for use as a sign plate, whereas when the thickness exceeds 10 mm, the support cannot be cut easily and becomes heavy.

The support needs to have a Shore D hardness of not less than 35°. By the Shore D hardness is meant the hardness as measured by a Shore durometer by way of the length of the part of a needle, that had been pressed into a specimen upon application of a load (4536 g).

The preferable range of the Shore D hardness is not less than 55°, particularly not less than 70°. When the Shore D hardness is less than 35°, the support unpreferably warps and the sign plate obtained therefrom does not have sufficient supporting function.

The total light transmission according to ASTM D-1003 of the support in the present invention is not less than 70%.

The preferable range of the total light transmission is not less than 75%, particularly desirably not less than 80%. When the transmission is less than 70%, the processed products, such as a sign plate and the like, will be low-graded, which in turn makes it difficult to obtain products with good design.

The thermal deformation temperature according to ASTM D-648 of the support is preferably 60° C.–90° C. More preferably, thermal deformation temperature is 70° C.–80° C. When it is less than 60° C., the laminate is deformed during development and drying in a plate making step, and when it exceeds 90° C., the workability during processing of the laminate into a final product, such as a sign plate and the like, lowers.

A support having the aforementioned characteristics is prepared from a polyethylene terephthalate resin, an acrylic resin and the like. These resins may be copolymers, blends of polymers, resins modified by adding an additive such as a plasticizer, and the like.

Particularly, a polyethylene terephthalate resin and a modified polyethylene terephthalate resin are preferably used. When transparency is desired or good processability, particularly cutting property, is desired, a modified polyethylene terephthalate resin is preferable.

A polyethylene terephthalate resin can be modified by copolymerization with a glycol component or dicarboxylic acid component, blending with modified polyethylene terephthalate and the like. In consideration of the strength and stability of the resin, copolymerization is preferable.

The glycol component to be copolymerized may be, for example, butanediol, hexanediol, neopentyl glycol, 1,4- cyclohexyldimethanol and the like. Examples of the dicarboxylic acid component include adipic acid, sebacic acid, isophthalic acid, 1,4-cyclohexyldicarboxylic acid and the like. The amount of the components to be copolymerized is 5–40 mol %, particularly 10–30 mol %, of the resin.

The photosensitive resin composition constituting the photosensitive resin layer may be any that is known. Specific examples include a photosensitive resin composition containing a soluble high molecular weight compound (e.g., polyvinyl alcohol, polyamide, polyether ester amide, polyether amide, polyurethane and the like), a photopolymerizable or photocrosslinkable monomer (e.g., acrylate of polyhydric alcohol, epoxy acrylate of polyhydric alcohol, N-methylolacrylic amide and the like), a photopolymerization initiator (e.g., benzyldimethyl ketal, benzoindimethyl ether and the like), and heat stabilizer, plasticizer, surfactant, dye and the like on demand, and the like.

To be specific, a resin that can be a binder to a photosensitive resin composition containing polyether amide (e.g., JP-A-55-79437 and the like), a photo sensitive resin composition containing polyether ester amide (e.g., JP-A-58-113537 and the like), a photosensitive resin composition containing tertiary nitrogen-containing polyamide (e.g., JP-A-50-76055 and the like), a photosensitive resin solution obtained by dissolving ammonium salt type tertiary nitrogen atom-containing polyamide (e.g., JP-A-53-36555 and the like), an addition polymer of amide compound having one or more amide bonds and an organic diisocyanate compound (e.g., JP-A-58-140737 and the like), an addition polymer of diamine without amide bond and an organic diisocyanate compound (e.g., JP-A-4-97154 and the like), and the like in a solvent and adding a photopolymerizable or photo crosslinkable monomer (e.g., acrylate of polyhydric alcohol, epoxy acrylate of polyhydric alcohol, N-methylolacrylic amide and the like), photopolymerization initiator (e.g., benzyldimethyl ketal, benzoindimethyl ether and the like), and the like is added thereto. The photosensitive resin composition thus obtained may contain, where necessary, heat stabilizer, plasticizer, surfactant, dye and the like.

The photosensitive resin layer can be obtained by, for example, flow casting the above-mentioned photosensitive resin solution on a polyester film or sheet, which is a support, and removing the solvent.

In the present invention, the photosensitive resin is laminated in a solid state on a support to give a sheet or film for use. A solid state photosensitive resin layer has a thickness of preferably 500 $\mu$m–2000 $\mu$m, more preferably 600 $\mu$m–1500 $\mu$m. A photosensitive resin layer has a thickness that can be selected from this thickness range according to the object of use of the photosensitive resin laminate to be produced according to the present invention. A thickness of the photosensitive resin layer of less than 500 $\mu$m is unpreferable because it does not meet the height necessary as a printing plate or Braille slate. A thickness beyond 2000 $\mu$m is not desirable because it results in poor image reproducibility.

The laminate of the present invention can be produced by a known method. For example, heat press, laminating and the like can be employed for laminating on a support having an adhesive layer, though an adhesive layer is not always necessary. The photosensitive resin laminate of the present invention can be produced by press adhering a support, a photosensitive resin layer and a solvent between the two that dissolves or swells the photosensitive resin. Alternatively, it can be produced by heating a photosensitive resin to a temperature not less than the softening point of the resin and less than melting temperature, and press adhering the resin to a support or an adhesive layer.

The adhesive layer that can be interposed between a support and a photosensitive resin layer may be a known adhesive. Examples thereof include polyester urethane adhesive wherein a polyester has been cured with polyvalent isocyanate, epoxy adhesive and the like. Of these, a polyester urethane adhesive is preferable because it is superior in adhering a polyethylene terephthalate resin to a modified polyethylene terephthalate resin. The adhesive composition can contain a small amount of other components. Examples thereof include plasticizer, dye, ultraviolent absorbers, halation preventive, surfactant, photopolymerizable vinyl monomer and the like.

An adhesive layer can be generally formed on a support by applying a solution of an adhesive composition in a given thickness and removing the solvent. The coating method is exemplified by known methods using roll coater, curtain flow coater, slid dye coater, gravure coater, spray and the like. The adhesive layer after application to a support is typically dried by blowing a hot air in a drying furnace. The temperature for drying treatment is not less than 30° C. and not more than 120° C. In consideration of the thermal deformation of a support, a temperature of not more than 70° C. is preferable. The treatment time is 1 min–30 min.

An adhesive layer preferably has a thickness of 0.5 $\mu$m–100 $\mu$m. When the thickness is less than 0.5 $\mu$m, the adhesion between the photosensitive resin layer and the adhesive layer is hardly expressed. When the thickness of the adhesive layer is beyond 100 $\mu$m, the layer foams and air bubbles may be included therein when the layer is dried. For these reasons, the thickness of the adhesive layer is preferably 0.5 $\mu$m–100 $\mu$m, particularly preferably 1 $\mu$m–50 $\mu$m.

When a laminate is produced by press adhering a support, a photosensitive resin layer and a solvent between the two that dissolves or swells the photosensitive resin, the solvent may be a known solvent, such as hydrocarbon solvent (e.g., n-hexane and the like), ester solvent (e.g., ethyl acetate, isopropyl acetate and the like), alcohol (e.g., methanol, ethanol, isopropyl alcohol and the like), water and the like, depending on the components of binder resin, photosensitive resin and the like, with preference given to water that can be treated easily. The above-mentioned solvent can be used alone or may be a mixed solvent.

A method for interposing a solvent, that dissolves or swells the photosensitive resin, between a support and a photosensitive resin layer may be a known method. Specifically, spraying, dropping, immersion of a support or a photosensitive resin layer in a solvent and the like can be employed.

According to the above method, the presence of a solvent that dissolves or swells the photosensitive resin, which has been interposed between the support and the photosensitive resin layer, enables strong adhesion of a photosensitive resin layer to a support.

When a photosensitive resin is heated to a temperature of less than melt temperature and press adhered, the temperature during heating is not particularly limited as long as it is not less than a temperature at which the photosensitive resin softens. When a photosensitive resin is heated to a melting temperature, the photosensitive resin layer unpreferably has a strikingly degraded thickness accuracy.

The method for press adhering a support and a photosensitive resin layer may be a method comprising superimposing a support on a photosensitive resin layer and passing same between at least two rolls, a method comprising moving a laminate with a photosensitive resin layer thereof on a transport means, such as a belt, while pressing the support thereof with a roll, and the like. A preferable method is passing between at least two rolls, which retains the thickness accuracy of a photosensitive resin layer.

The pressure for press adhering a support to a photosensitive resin layer is 0.05 kg/m$^2$–1.5 kg/m$^2$, preferably 0.1 kg/m$^2$–1.0 kg/m$^2$.

The time of pressurization for press adhering a support to a photosensitive resin layer varies depending on the materials of the support and the photosensitive resin layer. The transport speed is 1 m/min–10 m/min, preferably 2 m/min–7 m/min.

The roll may be one made from a known material. It is preferable that it is made from a hard rubber capable of maintaining the thickness accuracy of a photosensitive resin layer.

The photosensitive resin laminate produced as above is exposed to ultraviolet rays from a chemical lamp, ultrahigh pressure mercury lamp and the like, through a negative film carrying letters and pictures, and developed with a solvent, that dissolves a photosensitive resin layer, and dried, whereby a type board for printing, a display panel, a Braille slate and the like can be obtained.

When the inventive photosensitive resin laminate is used as a sign plate, a pattern to be the background of the sign plate is directly printed on the support, or a paper or film, on which a pattern has been printed, is laminated to make the background of the sign plate. In this way, a rich supply of design can be afforded for the sign plate.

The present invention is explained in detail by referring to illustrative reference examples and examples. The present invention is not limited by these examples in any way.
<Measurement Method of Physical Properties>
Shore D Hardness The hardness as measured by a Shore durometer by way of the length of the part of a needle, that has been pressed into a specimen upon application of a load (4536 g).
Total Light Transmission
   Measured according to ASTM D-1003.
Thermal Deformation Temperature
   Measured according to ASTM D-648.

EXAMPLE 1

A support prepared from an isophthalic acid (10 mol %)-copolymerized polyethylene terephthalate resin having a Shore D hardness of 60°, a thickness of 1.5 mm, a total light transmission of 80% and a thermal deformation temperature of 70° C. was used.

For an adhesive layer, a polyester urethane adhesive was used and an adhesive composition solution was prepared as in the following. A polyester resin (80 parts by weight, Byron RV-200, manufactured by Toyo Boseki Kabushiki Kaisha) was dissolved in a mixed solvent (1940 parts by weight) of toluene/methyl ethyl ketone=80/20 (weight ratio) at 80° C. After cooling, DESMODUER HL (20 parts by weight, manufactured by Bayer) comprising hexamethylene diisocyanate and toluene diisocyanate as an isocyanurate polyvalent isocyanate and triethylenediamine (0.06 part by weight) as curing catalyst were added and the mixture was stirred for 10 min.

The thus-obtained adhesive composition was applied onto a 1.5 mm thick polyethylene terephthalate plate to an adhesive layer thickness of 7 μm and cured by drying at 50° C. for 15 min to give a support having an adhesive layer.

The photosensitive resin composition to be laminated was prepared as follows. ε-Caprolactam (525 parts by weight), a nylon salt (400 parts by weight) of N-(2-aminoethyl) piperazine and adipic acid, and a nylon salt (75 parts by weight) of 1,3-bis(aminomethyl)cyclohexane and adipic acid were subjected to melt condensation polymerization in an autoclave to give a nylon copolymer. The obtained copolymer (55 parts by weight) was dissolved in methanol (200 parts by weight) at 60° C. and glycidyl methacrylate (2 parts by weight) was added, and the mixture was stirred for 3 hr to allow reaction of glycidyl methacrylate with the copolymer terminals. To this solution was added methacrylic acid (4 parts by weight) and acrylate (35 parts by weight) obtained by open-addition reaction of triglycidyl ether of trimethylolpropane and acrylic acid, N-ethyltoluenesulfonamide (5 parts by weight), hydroquinonemonomethyl ether (0.1 part by weight), and benzyl dimethyl ketal (1.0 part by weight) were added to give a solution containing a photosensitive resin. This solution was cast on a polyester film and methanol was evaporated to give an 800 μm thick sheet made from a photosensitive resin composition.

The photosensitive resin composition sheet obtained above and the support having an adhesive layer were adhered and water was poured in between them. The laminate was passed between rubber rollers adjusted to have a gap clearance fitting the desired thickness of the laminate and the photosensitive resin layer was press adhered at 25° C. to give a photosensitive resin laminate.

The photosensitive resin laminate was left standing for one day and cut into a predetermined size with a circular saw teeth cutter. A negative was placed on the laminate and subjected to exposure, development, drying and post-exposure treatment to form a sign plate pattern. The obtained sign plate was heated to 70° C.–80° C. as necessary and bent. The plate was free of deformation of the support during plate making. In this way, a sign plate pattern with good design was obtained.

EXAMPLE 2

In the same manner as in Example 1 except that a polyethylene terephthalate resin having a Shore D hardness of 74°, a thickness of 1.5 mm, a total light transmission of 80% and a thermal deformation temperature of 90° C. was used as a support, a photosensitive resin laminates were produced.

The obtained photosensitive resin laminate was left standing for one day, and cut into a predetermined size with a circular saw teeth cutter. A negative was placed on the laminate and subjected to exposure, development, drying and post-exposure treatment to form a sign plate pattern. The obtained sign plate was free of generation of odor during processing and free of problem after immersion in acetone for 10 min. Separately, the obtained sign plate was heated to 90° C.–100° C. as necessary and bent. The plate was free of deformation of the support during plate making. In this way, a sign plate pattern with good design was obtained.

COMPARATIVE EXAMPLE 1

In the same manner as in Example 1 except that a phenol board, which was a 2 mm thick laminate plate of unbreached kraft paper-phenol resin layer, was used as a support, a photosensitive resin laminate was produced.

The obtained photosensitive resin laminate was left standing for one day, and cut into a predetermined size with a circular saw teeth cutter. A negative was placed on the laminate and subjected to exposure, development, drying and post-exposure treatment to form a sign plate pattern. The obtained sign plate did not stand the bending processing at 80° C. When the plate was heat processed at a high temperature, an odor was generated from the support, which necessitated the use of a mask.

EXAMPLE 3

In the same manner as in Example 1 except that an acrylic resin plate having a Shore D hardness of 75°, a thickness of 3 mm, a total light transmission of 91% and a thermal deformation temperature of 80° C. was used as a support, a photosensitive resin laminate was produced.

The obtained photosensitive resin laminate was left standing for one day, and cut into a predetermined size with a circular saw teeth cutter. A negative was placed on the laminate and subjected to exposure, development, drying and post-exposure treatment to form a sign plate pattern. The obtained sign plate was heated to 80° C.–90° C. as necessary and bent. The plate was free of deformation of the support during plate making. In this way, a sign plate pattern with good design was obtained.

EXAMPLE 4

In the same manner as in Example 1 except that a modified polyethylene terephthalate plate which was made from a neopentyl glycol (20 mol %)-copolymerized polyethylene terephthalate resin having a Shore D hardness of 60°, a thickness of 6 mm, a total light transmission of 80% and a thermal deformation temperature of 70° C. was used as a support, a photosensitive resin laminate was produced.

The obtained photosensitive resin laminate was left standing for one day, and cut into a predetermined size with a circular saw teeth cutter. A negative was placed on the laminate and subjected to exposure, development, drying and post-exposure treatment to form a sign plate pattern. The obtained sign plate was heated to 70° C.–80° C. as necessary and bent. The plate was free of deformation of the support during plate making. In this way, a sign plate pattern with good design was obtained.

EXAMPLE 5

As a support, a 4 mm thick modified polyethylene terephthalate plate was used, which had been made from an isophthalic acid (10 mol %) copolymerized polyethylene terephthalate resin.

In the same manner as in Example 1 except that the support as obtained above was used, a photosensitive resin laminate was produced.

The obtained photosensitive resin laminate was left standing for one day, and cut into a predetermined size with a circular saw teeth cutter. A negative was placed on the laminate and subjected to exposure, development, drying and post-exposure treatment to form a sign plate pattern. The plate was free of generation of odor when cutting into the predetermined size or in the sign plate pattern forming step. In addition, the plate was free of any problem after immersion in acetone.

EXAMPLE 6

In the same manner as in Example 1 except that a modified polyethylene terephthalate plate, which had been made from a 1,4-cyclohexyldimethanol (20 mol %)-copolymerized polyethylene terephthalate resin having a Shore D hardness of 65°, a thickness of 3 mm, a total light transmission of 80% and a thermal deformation temperature of 70° C. was used as a support, a photosensitive resin laminate was produced.

The obtained photosensitive resin laminate was left standing for one day, and cut into a predetermined size with a circular saw teeth cutter. A negative was placed on the laminate and subjected to exposure, development, drying and post-exposure treatment to form a sign plate pattern. The obtained sign plate was heated to 75° C.–85° C. as necessary and bent. The plate was free of deformation of the support during plate making. In this way, a sign plate pattern with good design was obtained.

The photosensitive resin laminate of the present invention permits easy bending of the support and is superior in design as evidenced by the thickness and transparency of the support. The inventive laminate is free of generation of odor from the support and can provide a photosensitive resin laminate suitable for a sign plate, a sign plate and the like. According to the method of the present invention, a photosensitive resin laminate can be produced efficiently even if a support involved is thick, hard or in a number of sheets, and greatly contributes to the pertinent industrial field.

This application is based on a patent application Nos. 11-092482, 11-095509 and 11-205237 filed in Japan, the content of which is hereby incorporated by reference.

What is claimed is:

1. A sign plate comprising a photosensitive resin laminate comprising a support suitable for use as a sign plate and a photosensitive resin layer formed on the support directly or via an adhesive layer, wherein the support has a Shore D hardness of not less than 35°, is made from a polyethylene terephthalate resin or a modified polyethylene terephthalate resin, a thickness of not less than 1 mm, and a total light transmission of not less than 70% and wherein the sign plate comprises a Braille slate.

2. The sign plate of claim 1, wherein the support has a thermal deformation temperature of 60° C.–90° C.

3. A sign plate comprising a photosensitive resin laminate comprising a support suitable for use as a sign plate and a photosensitive resin layer formed on the support directly or via an adhesive layer, wherein the support has a Shore D hardness of not less than 35°, is made from a polyethylene terephthalate resin or a modified polyethylene terephthalate resin, a thickness of not less than 1 mm, and a total light transmission of not less than 70% and wherein a background pattern is directly printed on the support.

4. The sign plate of claim 3, wherein the support has a thermal deformation temperature of 60° C.–90° C.

5. A sign plate comprising a photosensitive resin laminate comprising a support suitable for use as a sign plate and a photosensitive resin layer formed on the support directly or via an adhesive layer, wherein the support has a Shore D hardness of not less than 35°, is made from a polyethylene terephthalate resin or a modified polyethylene terephthalate resin, a thickness of not less than 1 mm, and a total light transmission of not less than 70% and wherein a paper or film on which a background pattern has been printed is laminated on the photosensitive resin laminate.

6. The sign plate of claim 5, wherein the support has a thermal deformation temperature of 60° C.–90° C.

7. A sign plate comprising a photosensitive resin laminate comprising a support suitable for use as a sign plate and a photosensitive resin layer formed on the support directly or via an adhesive layer, wherein the support has a thickness of not less than 1 mm, is made from a polyethylene terephthalate resin or a modified polyethylene terephthalate resin, and has a total light transmission of not less than 70% and wherein the sign plate comprises a Braille slate.

8. A sign plate comprising a photosensitive resin laminate comprising a support suitable for use as a sign plate and a photosensitive resin layer formed on the support directly or via an adhesive layer, wherein the support has a thickness of not less than 1 mm, is made from a polyethylene terephthalate resin or a modified polyethylene terephthalate resin, and has a total light transmission of not less than 70% and wherein a background pattern is directly printed on the support.

9. A sign plate comprising a photosensitive resin laminate comprising a support suitable for use as a sign plate and a photosensitive resin layer formed on the support directly or via an adhesive layer, wherein the support has a thickness of not less than 1 mm, is made from a polyethylene terephthalate resin or a modified polyethylene terephthalate resin, and has a total light transmission of not less than 70% and wherein a paper or film on which a background pattern has been printed is laminated on the photosensitive resin laminate.

10. A sign plate comprising a photosensitive resin laminate comprising a support suitable for use as a sign plate and a photosensitive resin layer capable of forming a sign plate pattern formed on the support directly or via an adhesive layer, wherein the support has a Shore D hardness of not less than 35°, is made from an acrylic resin or a modified acrylic resin, a thickness of not less than 1 mm, and a total light transmission of not less than 70% and wherein the sign plate comprises a Braille slate.

11. A sign plate comprising a photosensitive resin laminate comprising a support suitable for use as a sign plate and a photosensitive resin layer capable of forming a sign plate pattern formed on the support directly or via an adhesive layer, wherein the support has a Shore D hardness of not less than 35°, is made from an acrylic resin or a modified acrylic resin, a thickness of not less than 1 mm, and a total light transmission of not less than 70% and wherein a background pattern is directly printed on the support.

12. A sign plate comprising a photosensitive resin laminate comprising a support suitable for use as a sign plate and a photosensitive resin layer capable of forming a sign plate pattern formed on the support directly or via an adhesive layer, wherein the support has a Shore D hardness of not less than 35°, is made from an acrylic resin or a modified acrylic resin, a thickness of not less than 1 mm, and a total light transmission of not less than 70% and wherein a paper or film on which a background pattern has been printed is laminated on the photosensitive resin laminate.

* * * * *